United States Patent
Pai et al.

(10) Patent No.: US 8,305,156 B2
(45) Date of Patent: *Nov. 6, 2012

(54) PRINTED CIRCUIT BOARD

(75) Inventors: Yu-Chang Pai, Taipei Hsien (TW); Po-Chuan Hsieh, Taipei Hsien (TW); Chien-Hung Liu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 195 days.

This patent is subject to a terminal disclaimer.

(21) Appl. No.: 12/824,865

(22) Filed: Jun. 28, 2010

(65) Prior Publication Data

US 2011/0309898 A1  Dec. 22, 2011

(30) Foreign Application Priority Data

Jun. 17, 2010  (TW) ................ 99119772 A

(51) Int. Cl.
  *H04B 3/28*  (2006.01)
(52) U.S. Cl. ................ 333/12; 333/4; 333/246
(58) Field of Classification Search ............ 333/12, 333/204, 246, 4
See application file for complete search history.

(56) References Cited

U.S. PATENT DOCUMENTS

| 6,828,867 B2 * | 12/2004 | Ishikawa et al. ........ 331/107 DP |
| 7,466,214 B2 * | 12/2008 | Kanno et al. .................. 333/219 |
| 2010/0052820 A1 * | 3/2010 | Wu et al. ....................... 333/204 |

OTHER PUBLICATIONS

Liu et al., "An Embedded Common-Mode Suppression Filter for GHz Differential Signals Using Periodic Defected Ground Plane", IEEE Microwave & Wireless Components Letters, vol. 18, No. 4, Apr. 2008, pp. 248-250.*
Wu et al., "A Novel HU-shaped Common-mode Filter for GHz Differential Signals", IEEE International Symposium on Electromagnetic Compatibility, Aug. 18-22, 2008, pp. 1-4.*

* cited by examiner

*Primary Examiner* — Seungsook Ham
(74) *Attorney, Agent, or Firm* — Altis Law Group, Inc.

(57) ABSTRACT

A printed circuit board includes a signal layer and a ground layer adjacent to the signal layer. The signal layer includes a pair of differential transmitting lines. The ground layer includes a common mode filter formed by hollow spiral patterns in the ground layer. The common mode filter includes two filter portions respectively arranged at opposite sides of a projection of the pair of differential transmitting lines onto the ground layer. Hollowed areas of the two filter portions are bridged by a void.

3 Claims, 5 Drawing Sheets

PRINTED CIRCUIT BOARD

BACKGROUND

1. Technical Field

The present disclosure relates to a printed circuit board with common mode filters.

2. Description of Related Art

Nowadays, many printed circuit boards include differential signal lines arranged in signal layers of the printed circuit boards. To avoid common mode signals being transmitted through the differential signal lines, some common mode filters are connected to the differential signal lines to filter the common mode signals. However, these common mode filters takes up real estate on the printed circuit boards and thus increase the costs.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

Figure 1:
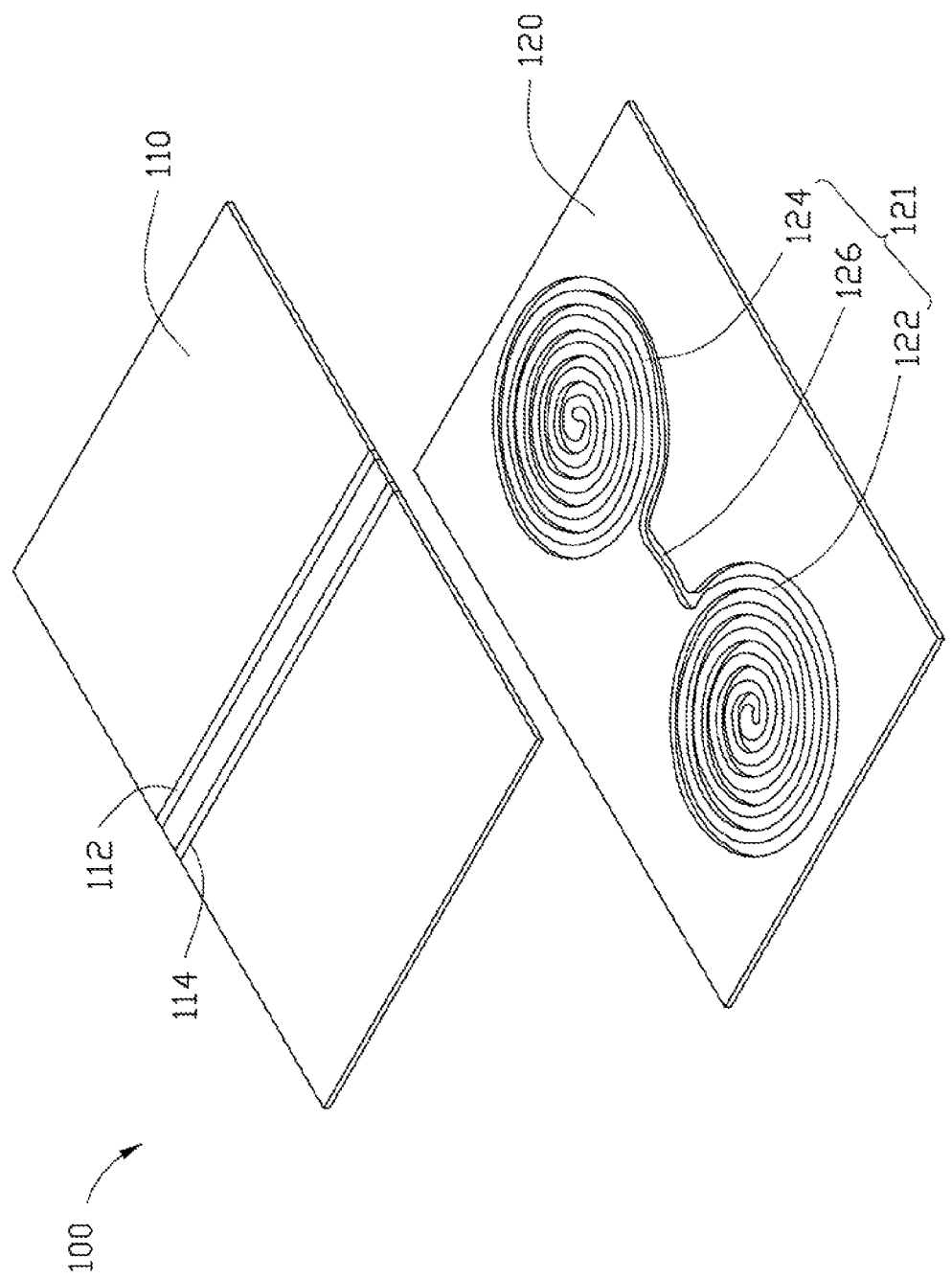
FIG. 1 is an exploded, isometric view of a printed circuit board, in accordance with an embodiment, the printed circuit board includes a common mode filter.
Figure 2:
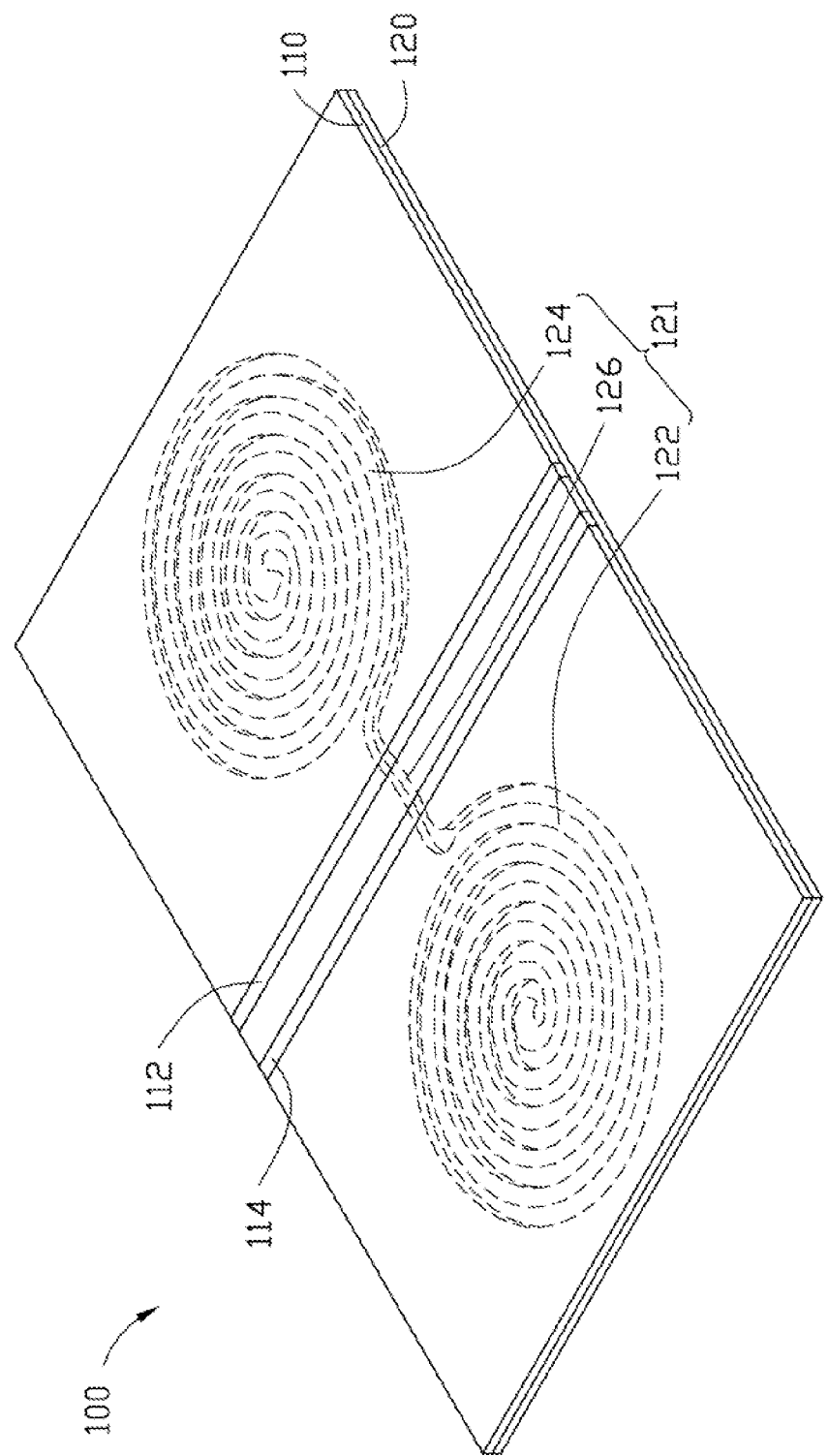
FIG. 2 is an assembled, isometric view of the printed circuit board of FIG. 1.

Referring to FIGS. 1 and 2, an embodiment of a printed circuit board (PCB) 100 includes a signal layer 110 and a ground layer 120 adjacent to and below the signal layer 110. The signal layer 110 and the ground layer 120 are spaced by insulating materials (not shown). The signal layer 110 includes a pair of differential transmitting lines 112 and 114. It may be understood that the PCB 100 also includes other layers, such as a power layer, for example. These other layers fall within well-known technologies, and are therefore not described here.

To avoid some common mode signals being transmitted through the pair of differential transmitting lines 112 and 114, the ground layer 120 is hollowed at some special positions to form a common mode filter 121. The common mode filter 121 includes two filter portions 122 and 124, the hollowed areas of the two filter portions 122 and 124 are bridged by an elongated void 126.

The two filter portions 122 and 124 are respectively symmetrically arranged at opposite sides of a projection of the pair of differential transmitting lines 112 and 114 on the ground layer 120. Each of the filter portions 122 and 124 are generally circular and consists of a spiral trace. In one embodiment, the elongated void 126 is perpendicular to the pair of differential transmitting lines 112 and 114. For common mode signals, two sides of the elongated void 126 form a capacitor, the filter portions 122 and 124 form two inductors in parallel with the capacitor. When common mode signals travel along the pair of differential transmitting lines 112 and 114, the frame of the filter portions 122 and 124 can result in resonance of inductor and capacitor, and the common mode signals will not easily pass through the pair of differential transmitting lines 112 and 114. Therefore, the common mode filter 121 can effectively prevent common mode signals from passing through the pair of differential transmitting lines 112 and 114.

Figure 3:
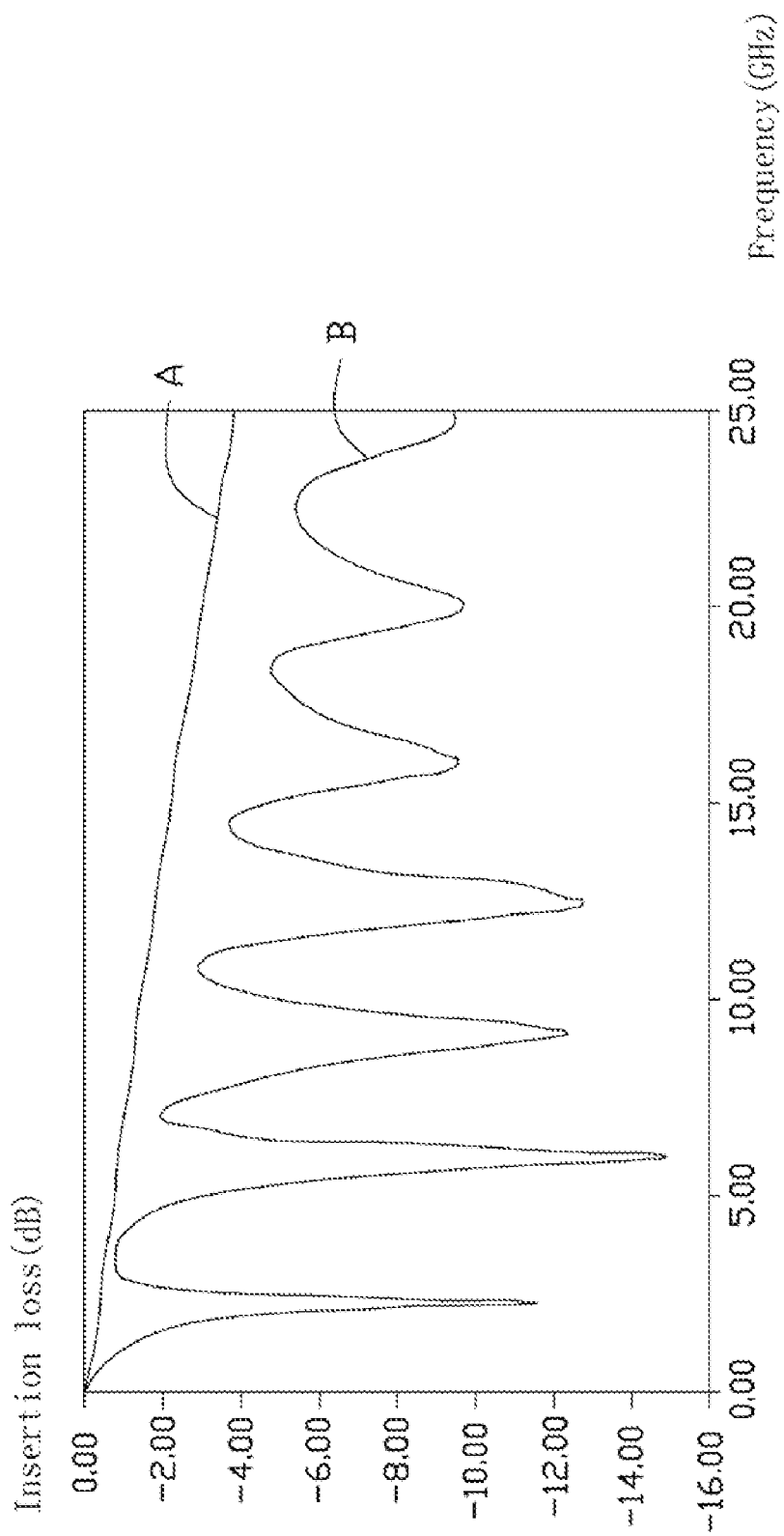
FIG. 3 is a simulation graph of insertion loss of the common mode filter of the printed circuit of FIG. 1.

Referring to FIG. 3, the curve A indicates insertion loss when differential signals are transmitted through the common mode filter 121, and the curve B indicates insertion loss when common mode signals are transmitted through a single common mode filter 121. Obviously, the differential signals are almost entirely transmitted through the common mode filter 121, but the common mode signals are effectively filtered, especially at a special frequency value, such as at about 3.0 gigahertzs (GHz), 6.0 GHz, 9.0 GHz, and 12.5 GHz, In other words, substantially harmonics of 3.0 GHz being a resonant frequency of the inductors and capacitor in parallel. In other embodiments, the resonant frequency of the inductors and capacitor may be adjusted by changing some parameters, such as capacitance of the capacitor formed by the sides of the elongated void 126, and inductance of the inductor formed by the filter portions 122 and 124. The capacitance of the capacitor could be regulated by changing the width of the elongated void 126, and the inductance of the inductor could be regulated by changing the number of turns of the spiral traces of the filter portions 122 and 124, and/or width of the spiral traces of the filter portions 122 and 124.

Figure 4:
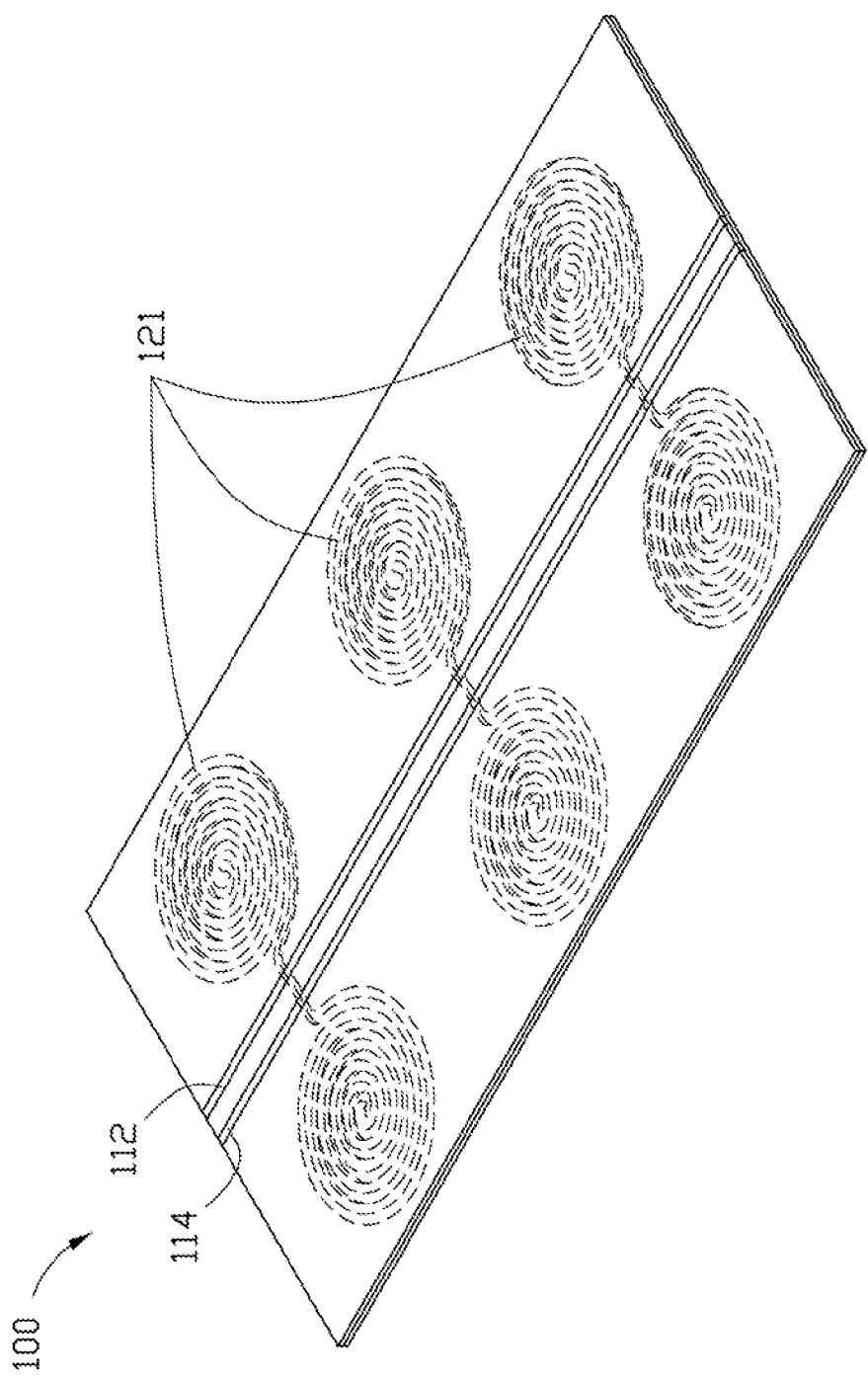
FIG. 4 is similar to FIG. 2, but including three common mode filters.

Referring to FIG. 4, another embodiment of a printed circuit board (PCB) 100 includes three common mode filters 121 passed by the differential transmitting lines 112 and 114. In other embodiments, the number of the common mode filter 121 could be regulated according to need.

Figure 5:
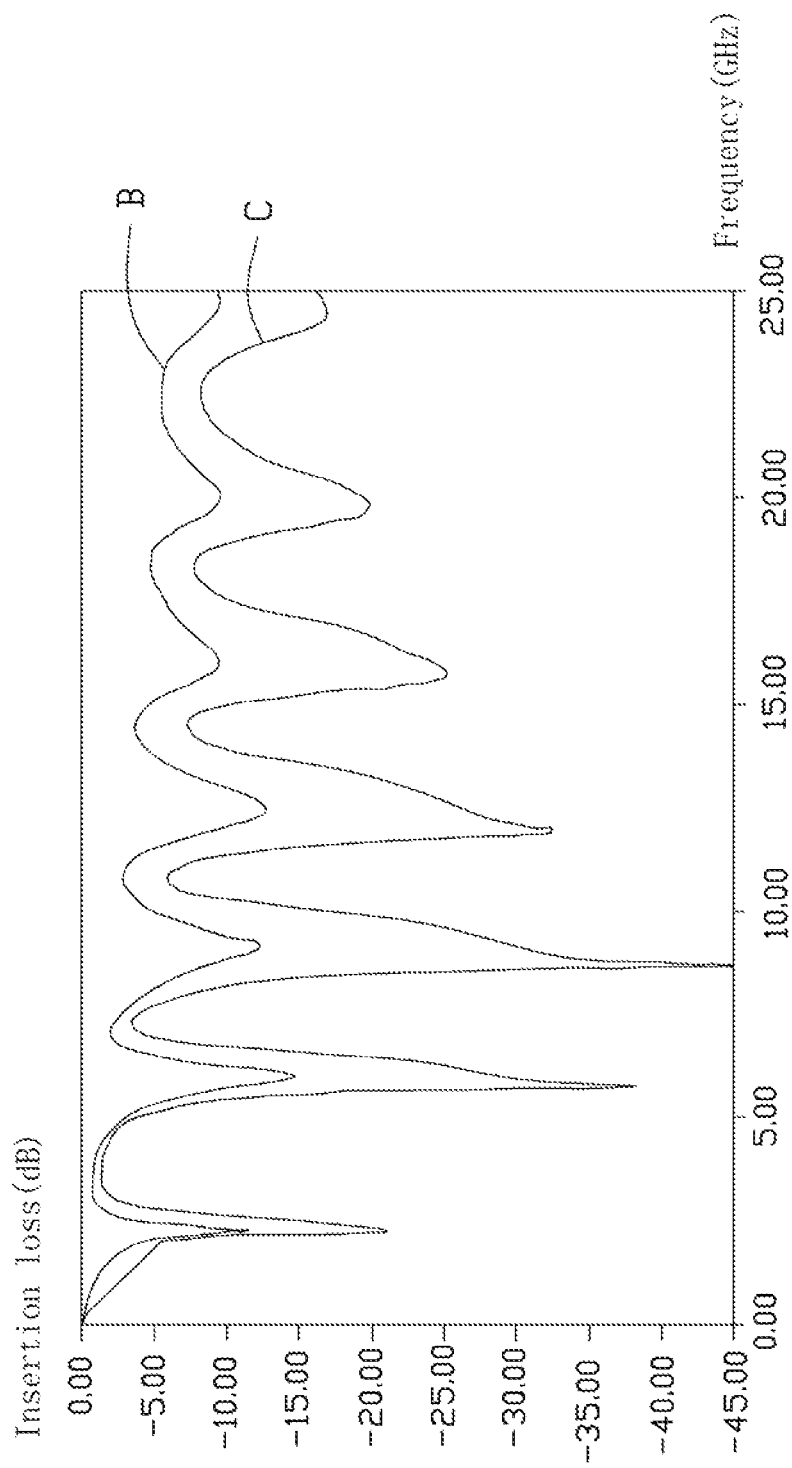
FIG. 5 is a simulation graph of insertion loss of the common mode filters of the printed circuit of FIG. 4.

Referring to FIG. 5, the curve C indicates insertion loss when common mode signals are transmitted through three common mode filters 121, the dips of the insertion loss are obviously deeper relative to when common mode signals are transmitted through a single common mode filter 121.

The PCB 100 does not use any SMD common mode filters arranged on the PCB 100, therefore space and cost are saved.

It is to be understood, however, that even through numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A printed circuit board comprising:
   a signal layer comprising a pair of differential transmitting lines; and
   a ground layer adjacent to and below the signal layer, the ground layer comprising a common mode filter formed by spirally hollowing the ground layer, wherein the ground layer and signal layer are spaced by insulating material, the common mode filter comprising two filter portions respectively arranged at opposite sides of a projection of the pair of differential transmitting lines on the ground layer; wherein hollowed areas around the two filter portions are bridged by a void.

2. The printed circuit board of claim 1, wherein a shape of each of the two filter portions is substantially circular, and the two filter portions respectively arranged at opposite sides of a projection of the pair of differential transmitting lines in the ground layer, symmetrically.

3. The printed circuit board of claim 2, wherein the void is elongated and perpendicular to the pair of differential transmitting lines.

* * * * *